(12) United States Patent
Aoki

(10) Patent No.: US 10,381,979 B2
(45) Date of Patent: Aug. 13, 2019

(54) ELECTRONIC COMPONENT PACKAGE, OSCILLATOR, ELECTRONIC APPARATUS, AND VEHICLE

(71) Applicant: SEIKO EPSON CORPORATION, Tokyo (JP)

(72) Inventor: Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 56 days.

(21) Appl. No.: 15/717,281

(22) Filed: Sep. 27, 2017

(65) Prior Publication Data
US 2018/0097476 A1 Apr. 5, 2018

(30) Foreign Application Priority Data
Oct. 3, 2016 (JP) .................................. 2016-195453

(51) Int. Cl.
| | | |
|---|---|---|
| H01L 41/047 | (2006.01) | |
| H03B 5/32 | (2006.01) | |
| H03H 9/05 | (2006.01) | |
| H03H 9/19 | (2006.01) | |
| H03B 5/02 | (2006.01) | |

(52) U.S. Cl.
CPC ........... *H03B 5/02* (2013.01); *H01L 41/0471* (2013.01); *H01L 41/0472* (2013.01); *H03B 5/32* (2013.01); *H03H 9/0538* (2013.01); *H03H 9/19* (2013.01)

(58) Field of Classification Search
CPC ............... H01L 41/047; H01L 41/0471; H01L 41/0472; H01L 41/0474; H03B 5/02; H03B 5/30; H03B 5/32; H03H 9/0538; H03H 9/0547; H03H 9/19

USPC ........................................... 331/68, 154, 158
See application file for complete search history.

(56) References Cited

U.S. PATENT DOCUMENTS

| | | | | |
|---|---|---|---|---|
| 6,229,249 | B1 * | 5/2001 | Hatanaka ................. | H03B 5/04 310/348 |
| 7,378,780 | B2 * | 5/2008 | Mizumura ........... | H03H 9/0552 310/341 |
| 2003/0189222 | A1 * | 10/2003 | Itou ..................... | H01L 21/4828 257/200 |
| 2005/0184626 | A1 * | 8/2005 | Chiba .................. | H03H 9/0547 310/348 |
| 2007/0075796 | A1 * | 4/2007 | Mizumura ............... | H03B 5/04 331/158 |

(Continued)

FOREIGN PATENT DOCUMENTS

| | | |
|---|---|---|
| JP | 2007-189285 A | 7/2007 |
| JP | 2008-34494 A | 2/2008 |
| JP | 5910351 B2 | 4/2016 |

*Primary Examiner* — Levi Gannon
(74) *Attorney, Agent, or Firm* — Oliff PLC

(57) ABSTRACT

An electronic component package includes: a first side surface terminal provided on a first side surface; a first external connection terminal provided on a mounting surface (rear surface); a first recess electrode provided in a first recess and electrically connected with the first external connection terminal; and a first branch wiring disposed on a front surface of a middle plate and including a first end exposed in the first side surface between the first side surface terminal and the first recess electrode. The relation: L11>L12 is satisfied, where L11 is the distance between the first end and the first recess electrode and L12 is the distance between the first end and the first side surface terminal.

16 Claims, 9 Drawing Sheets

(56) References Cited

U.S. PATENT DOCUMENTS

| | | | |
|---|---|---|---|
| 2009/0066426 A1* | 3/2009 | Harima | H03H 9/0547 331/44 |
| 2014/0361842 A1* | 12/2014 | Chen | H03B 5/36 331/44 |
| 2015/0143903 A1* | 5/2015 | Aoki | G01C 19/5628 73/504.12 |
| 2018/0123512 A1* | 5/2018 | Abe | H03B 1/04 |

* cited by examiner

ELECTRONIC COMPONENT PACKAGE, OSCILLATOR, ELECTRONIC APPARATUS, AND VEHICLE

CROSS REFERENCE

This application claims benefit of Japanese Application JP 2016-195453, filed on Oct. 3, 2016. The disclosure of the prior application is hereby incorporated by reference herein in its entirety.

BACKGROUND

1. Technical Field

The present invention relates to an electronic component package, an oscillator, an electronic apparatus, and a vehicle.

2. Related Art

In the related art, a piezoelectric device, such as a quartz crystal resonator or a quartz crystal oscillator, that can obtain a signal at a desired frequency by accommodating (containing) a resonating element (quartz crystal resonator plate) formed of a piezoelectric body such as quartz crystal and a circuit element that drives the resonating element in an accommodating space (cavity) of an electronic component package for obtaining a signal at a stable frequency has been used in the fields of communication apparatuses and the like. As the piezoelectric device described above, a surface mounting-type piezoelectric oscillator is disclosed, in which resonating-element electrically conducting wirings electrically conducted to resonating-element mounting pads and a circuit-element electrically conducting wiring electrically conducted to a circuit-element mounting pad are disposed close to each other in a non-electrically conducting state on the bottom surface of an accommodating space of an electronic component package (e.g., see JP-A-2007-189285). In the surface mounting-type piezoelectric oscillator as disclosed in JP-A-2007-189285, branch wirings branching off from the resonating-element electrically conducting wiring and the circuit-element electrically conducting wiring are provided. The branch wiring is used as, for example, an electrically conducting wiring when an electroplating process is performed on the resonating-element electrically conducting wiring, the circuit-element electrically conducting wiring, and the like.

However, in the electronic component package used in the piezoelectric oscillator disclosed in JP-A-2007-189285, a branch wiring located between a side surface terminal and a castellation electrode (recess electrode) is provided substantially at the middle between the side surface terminal and the castellation electrode. In this case, as the electronic component package is reduced in size, the distance between the branch wiring and the side surface terminal and the distance between the branch wiring and the castellation electrode are reduced in proportion to the reduction in the size of the electronic component package. When the piezoelectric oscillator using the electronic component package reduced in size is mounted on a circuit board or the like, a connection member such as solder creeping up from an external connection terminal provided on the rear surface (outer bottom surface) of the electronic component package to the castellation electrode connected with the external connection terminal reaches the branch wiring close to the connection member and thus the risk of an electrically short circuit (short) is increased.

SUMMARY

An advantage of some aspects of the invention is to solve at least apart of the problems described above, and the invention can be implemented as the following forms or application examples.

Application Example 1

An electronic component package according to this application example is an electronic component package including amounting surface on which a first external terminal is provided. The electronic component package includes: a first substrate including a front surface and a side surface, the side surface including a first side surface, a second side surface crossing the first side surface, a third side surface opposed to the first side surface, a fourth side surface opposed to the second side surface, and a first recess connecting the first side surface with the second side surface; a first side surface terminal provided on the first side surface; a first recess electrode provided in the first recess and electrically connected with the first external terminal; and a first branch wiring provided on the front surface and including a first end exposed in the first side surface between the first side surface terminal and the first recess electrode, wherein, in a plan view of the front surface, the relation: $L11>L12$ is satisfied, where $L11$ is the distance between the first end and the first recess electrode and $L12$ is the distance between the first end and the first side surface terminal.

According to the electronic component package according to this application example, by making the distance ($L11$) between the first end of the first branch wiring and the first recess electrode larger than the distance ($L12$) between the first end and the first side surface terminal, the position of the first end with respect to the first recess electrode is disposed at a position farther than the intermediate position from the first side surface terminal to the first recess electrode. In other words, the position of the first end is disposed at a position closer to the first side surface terminal side, where the creeping up of solder or the like is less likely to occur, than the intermediate position from the first side surface terminal to the first recess electrode. Hence, it is possible to reduce the risk of occurrence of an electrical short circuit (short) between the first end and the first recess electrode due to solder or the like creeping up the first recess electrode at the time of mounting on a circuit board or the like, and the electronic component package with high reliability can be obtained.

The term "crossing" as used herein means that the surfaces are not parallel to each other (e.g., are substantially orthogonal to each other) when the surfaces extend. The term "distance" as used herein means the shortest distance between objects. Moreover, the term "branch wiring" as used in the invention means a wiring whose one end is connected to a signal wiring, such as a wiring electrically conducted to a resonating element or a wiring electrically conducted to a circuit element, or a pad, and whose other end is electrically floating.

Application Example 2

In the electronic component package according to the application example, it is preferable that the first branch wiring is electrically connected with the first side surface terminal.

According to this application example, since the first branch wiring is electrically connected with the first side surface terminal, a problem does not occur even if the first side surface terminal and the first end contact with each other on the first side surface. Therefore, the first side surface terminal and the first end can be close to each other, and the first side surface terminal can be disposed at a position farther away from the first recess electrode.

Application Example 3

In the electronic component package according to the application example, it is preferable that a second external terminal is further provided on the mounting surface, that the side surface further includes a second recess connecting the second side surface with the third side surface, that the electronic component package further includes a second recess electrode provided in the second recess and electrically connected with the second external terminal, and a second branch wiring including a second end exposed in the second side surface between the first recess electrode and the second recess electrode, and that, in the plan view of the front surface, the relation: $L21-L22 \leq LW$ is satisfied, where $L21$ is the distance between the second end and the first recess electrode, $L22$ is the distance between the second end and the second recess electrode, and $LW$ is the width dimension of the second end.

According to this application example, the second end is located in the second side surface between the first recess electrode and the second recess electrode and disposed substantially at the middle between the first recess electrode and the second recess electrode. That is, by separating the second end substantially equally from the first recess electrode and the second recess electrode located on both sides, it is possible to reduce the risk of occurrence of an electrical short circuit (short) between the second end and each of the first recess electrode and the second recess electrode due to solder or the like creeping up the first recess electrode and the second recess electrode.

Application Example 4

In the electronic component package according to the application example, it is preferable that a second external terminal is further provided on the mounting surface, that the side surface further includes a second recess connecting the second side surface with the third side surface, that the electronic component package further includes a second recess electrode provided in the second recess and electrically connected with the second external terminal, and a third branch wiring including a third end exposed in the third side surface, that the first external terminal is an output terminal, that the second external terminal is a power supply terminal or a ground terminal, and that the area of an overlapping portion of the first branch wiring and the first external terminal in the plan view is smaller than the area of an overlapping portion of the third branch wiring and the second external terminal in the plan view.

According to this application example, by making smaller the area of the overlapping portion of the first branch wiring and the first external terminal as an output terminal in the plan view, characteristic degradation due to the influence of capacitive coupling relating to the output terminal can be reduced. The influence on the characteristics of the power supply terminal or the ground terminal can be ignored even when the power supply terminal or the ground terminal overlaps the third branch wiring in the plan view.

Application Example 5

In the electronic component package according to the application example, it is preferable that the $L11$ satisfies the relation: $0.15 \text{ mm} \leq L11 < PL$ where $PL$ is the distance between the first recess electrode and the first side surface terminal. According to this application example, the position of the first end of the first branch wiring is located between the first recess electrode and the first side surface terminal, and the distance ($L11$) between the first end and the first recess electrode is 0.15 mm or more. Since the position of the first end is disposed at a distance of 0.15 mm or more from the first recess electrode, the first branch wiring can be easily formed.

Application Example 6

In the electronic component package according to the application example, it is preferable that the $L12$ satisfies the relation: $0.15 \text{ mm} \leq L12 < (L11+L12)/2$.

According to this application example, the distance ($L12$) between the first end of the first branch wiring and the first side surface terminal is less than $(L11+L12)/2$ and 0.15 mm or more. That is, the position of the first end is disposed at a distance of 0.15 mm or more from the first side surface terminal and at a position closer to the first side surface terminal than the middle between the first recess electrode and the first side surface terminal with the first end therebetween. Therefore, the distance between the first recess electrode and the first end can be sufficiently provided. With this configuration, it is possible to reduce the risk of occurrence of an electrical short circuit (short) between the first end and the first recess electrode due to solder or the like creeping up the first recess electrode at the time of mounting on a circuit board or the like, and the first branch wiring can be easily formed.

Application Example 7

In the electronic component package according to the application example, it is preferable that the $L21$ satisfies the relations: $0.15 \text{ mm} \leq L21 \leq PW/2$ and $0.15 \text{ mm} \leq L22 \leq PW/2$ where $PW$ is the width dimension of the second side surface in a direction in which the first recess electrode, the second recess electrode, and the second end are arranged.

According to this application example, the distance ($L21$, $L22$) between the second end of the second branch wiring and the first recess electrode or the second recess electrode is half or less of the distance (the width dimension $PW$ of the second side surface) between the first recess electrode and the second recess electrode and is 0.15 mm or more. Therefore, the second branch wiring can be easily formed and also it is possible to reduce the risk of occurrence of an electrical short circuit (short) between the second end and the first recess electrode or the second recess electrode due to solder or the like creeping up the first recess electrode or the second recess electrode at the time of mounting on a circuit board or the like.

Application Example 8

An oscillator according to this application example includes: the electronic component package according to any one of the application examples described above; a resonating element accommodated in the electronic component package; and a circuit element including at least a portion of an oscillation circuit that causes the resonating element to oscillate.

According to the oscillator according to this application example, since the oscillator uses the electronic component package capable of reducing the risk of occurrence of an electrical short circuit (short) between the first end or the second end and the first recess electrode due to solder or the like creeping up the first recess electrode at the time of mounting on a circuit board or the like, it is possible provide the oscillator with high reliability.

Application Example 9

An electronic apparatus according to this application example includes an electronic component including the electronic component package according to any one of the application examples described above.

According to the electronic apparatus according to this application example, since the electronic apparatus includes the electronic component using the electronic component package capable of reducing the risk of occurrence of an electrical short circuit (short) between the first end or the second end and the first recess electrode due to solder or the like creeping up the first recess electrode at the time of mounting on a circuit board or the like, it is possible provide the electronic apparatus with high reliability.

Application Example 10

A vehicle according to this application example includes an electronic component including the electronic component package according to any one of the application examples described above.

According to the vehicle according to this application example, since the vehicle includes the electronic component using the electronic component package capable of reducing the risk of occurrence of an electrical short circuit (short) between the first end or the second end and the first recess electrode due to solder or the like creeping up the first recess electrode at the time of mounting on a circuit board or the like, it is possible provide the vehicle with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the accompanying drawings. For convenience of description, the X-axis, the Y-axis, and the Z-axis are illustrated as three axes orthogonal to each other in each of the drawings. In the following, a direction parallel to the X-axis is referred to as "X-axis direction"; a direction parallel to the Y-axis is referred to as "Y-axis direction; and a direction parallel to the Z-axis is referred to as "Z-axis direction". Moreover, the +Z-axis side may be referred to as "upper", "above", "front", or "front side", while the −Z-axis side may be referred to as "lower", "under", "rear", or "rear side".

Figure 1:
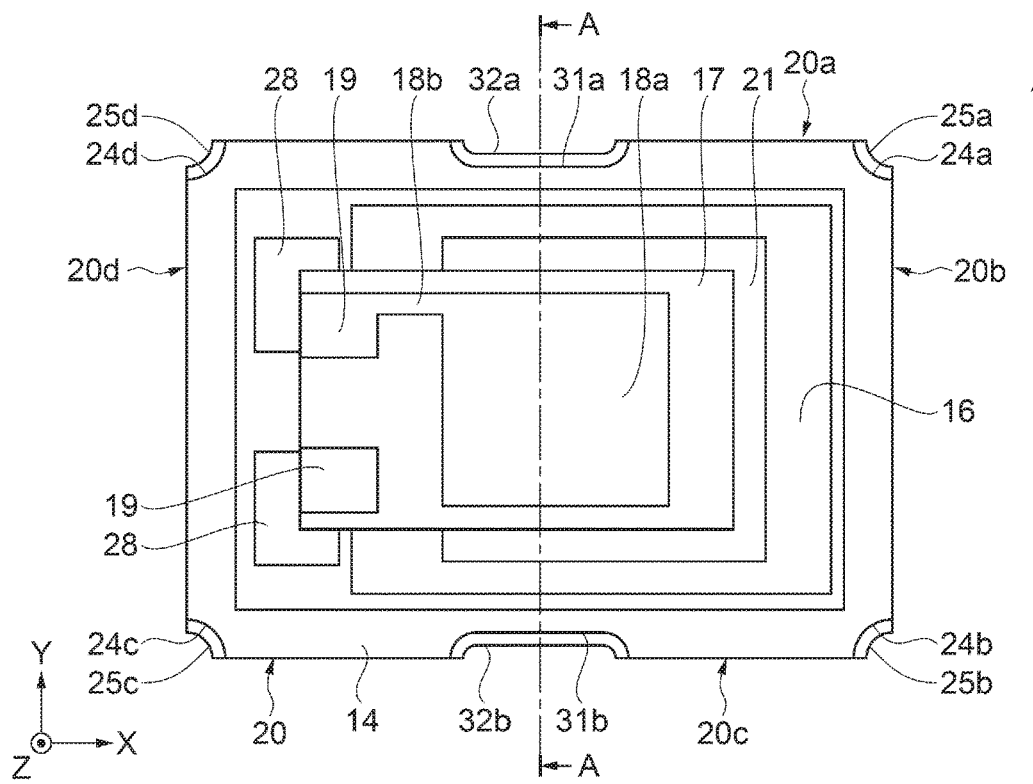
FIG. 1 is a plan view showing an overview of an oscillator as an electronic component using an electronic component package according to an embodiment of the invention.
Figure 2:
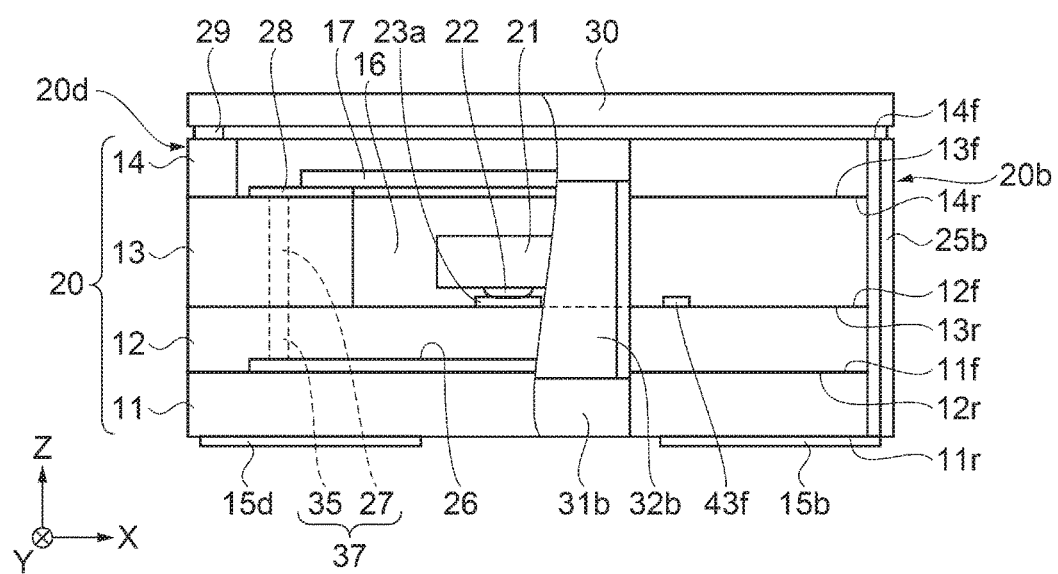
FIG. 2 is an elevation view (partial cross-sectional view) showing an overview of the oscillator as the electronic component.
Figure 3:
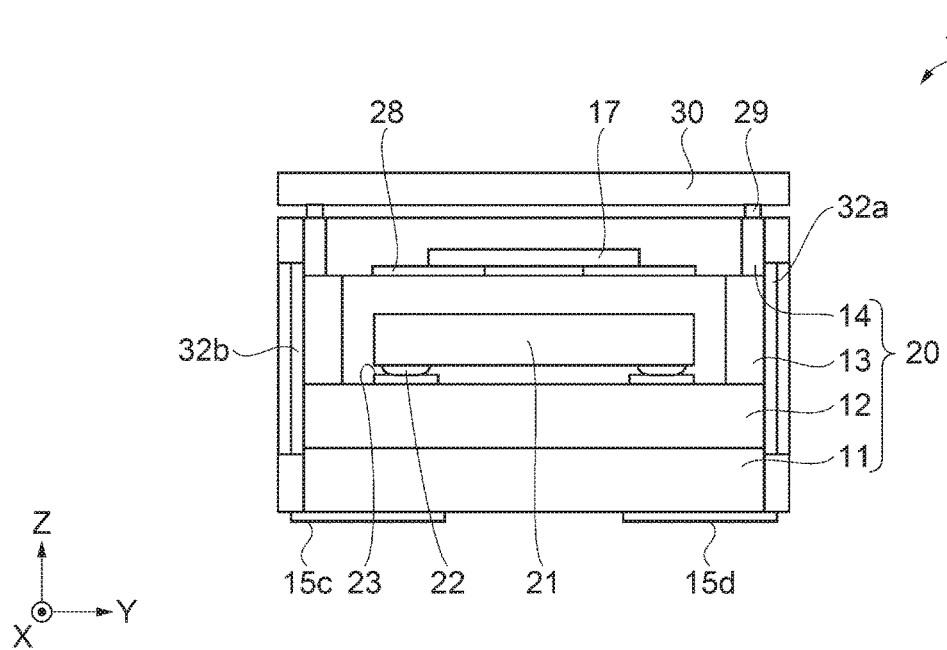
FIG. 3 is a cross-sectional view (side view) taken along line A-A in FIG. 1, showing an overview of the oscillator as the electronic component.

With reference to FIGS. 1, 2, and 3, an oscillator as an electronic component according to an embodiment of the invention will be described. FIGS. 1, 2, and 3 show an overview of the oscillator as the electronic component according to the embodiment of the invention, in which FIG. 1 is a plan view; FIG. 2 is an elevation view (partial cross-sectional view); and FIG. 3 is a cross-sectional view (side view) taken along line A-A in FIG. 1. In FIG. 1, a lid 30 and a seam ring 29, which are shown in FIG. 2, are omitted (shown in a see-through manner).

The oscillator 1 as the electronic component according to the embodiment of the invention is a so-called temperature compensated crystal oscillator (temperature compensated x'tal oscillator (TCXO)) in which a quartz crystal resonator element 17 as a resonating element and a circuit element 21 are accommodated (contained) in a package 20 as an electronic component package as shown in FIGS. 1, 2, and 3. The oscillator 1 includes the quartz crystal resonator element 17, the circuit element 21 including at least an oscillation circuit that causes the quartz crystal resonator element 17 to oscillate and a circuit (temperature compensation circuit) having the characteristic of compensating for the temperature characteristics of the quartz crystal resonator element 17, the package 20 (electronic component package) accommodating the quartz crystal resonator element 17 and the circuit element 21, and the lid 30 as a lid portion that forms an interior space (containing space) 16 between the package 20 and the lid 30. Hereinafter, the quartz crystal resonator element 17, the package 20, the circuit element 21, and the lid 30 as a lid portion will be successively described in detail.

Quartz Crystal Resonator Element as Resonating Element

An AT-cut quartz crystal substrate (piezoelectric substrate) formed of quartz crystal as one example of a piezoelectric material is used for the quartz crystal resonator element 17 of the embodiment. Although not shown in the drawing, the piezoelectric material such as quartz crystal belongs to the trigonal system and includes crystal axes X, Y, and Z orthogonal to each other. The X-axis, the Y-axis, and the Z-axis are referred to as "electrical axis", "mechanical axis", and "optic axis", respectively. A flat plate cut from quartz crystal along a plane that is obtained by rotating the XZ plane by a predetermined angle θ around the X-axis is used as the quartz crystal substrate. For example, in the case of the AT-cut quartz crystal substrate, θ is substantially 35° 15'. The Y-axis and the Z-axis are also rotated by θ around the X-axis, which are then referred to as "Y' axis" and "Z' axis", respectively. Accordingly, the AT-cut quartz crystal substrate includes the crystal axes X, Y', and Z' orthogonal to each other. In the AT-cut quartz crystal substrate, the thickness direction is the Y' axis, the XZ' plane (plane including the X-axis and the Z' axis) orthogonal to the Y' axis is a major surface, and a thickness-shear vibration is excited as a primary vibration. A piezoelectric substrate as a blank of the quartz crystal resonator element 17 can be obtained by processing the AT-cut quartz crystal substrate. That is, the piezoelectric substrate is formed of the AT-cut quartz crystal substrate, which is composed of the plane parallel to the X-axis and the Z' axis and has a thickness in a direction parallel to the Y' axis, where, in the orthogonal coordinate system composed of the X-axis (electrical axis), the Y-axis (mechanical axis), and the Z-axis (optic axis), the Z' axis is an axis obtained by inclining the Z-axis in the −Y-direction of the Y-axis about the X-axis, and the Y' axis is an axis obtained by inclining the Y-axis in the +Z-direction of the Z-axis about the X-axis.

The quartz crystal substrate according to the invention is not limited to the AT cut in which the above-described angle θ is substantially 35° 15', but other piezoelectric substrates such as an SC cut and a BT cut, which excite the thickness-shear vibration, can be widely applied.

The quartz crystal resonator element 17 of the embodiment is provided with various electrodes on the front and rear surfaces (major surfaces) of an element piece of the AT-cut quartz crystal substrate (piezoelectric substrate) formed in a rectangular shape using quartz crystal as one example of the piezoelectric material. In the example, excitation electrodes 18a, connection electrodes 19, and extraction electrodes 18b connecting the excitation electrode 18a with the connection electrode 19 are formed as the various electrodes. For the sake of legibility of the drawing, the various electrodes are not shown in FIG. 2. The excitation electrodes 18a are provided in a substantially rectangular shape in the central portions of the front and rear major surfaces of the quartz crystal resonator element 17. The connection electrodes 19 are disposed extending from the excitation electrodes 18a through the extraction electrodes 18b to one ends of the front and rear major surfaces. The excitation electrodes 18a and the connection electrodes 19 on the front and rear surfaces are provided in substantially the same shape so as to be opposed to each other.

Electronic Component Package

Figure 4:
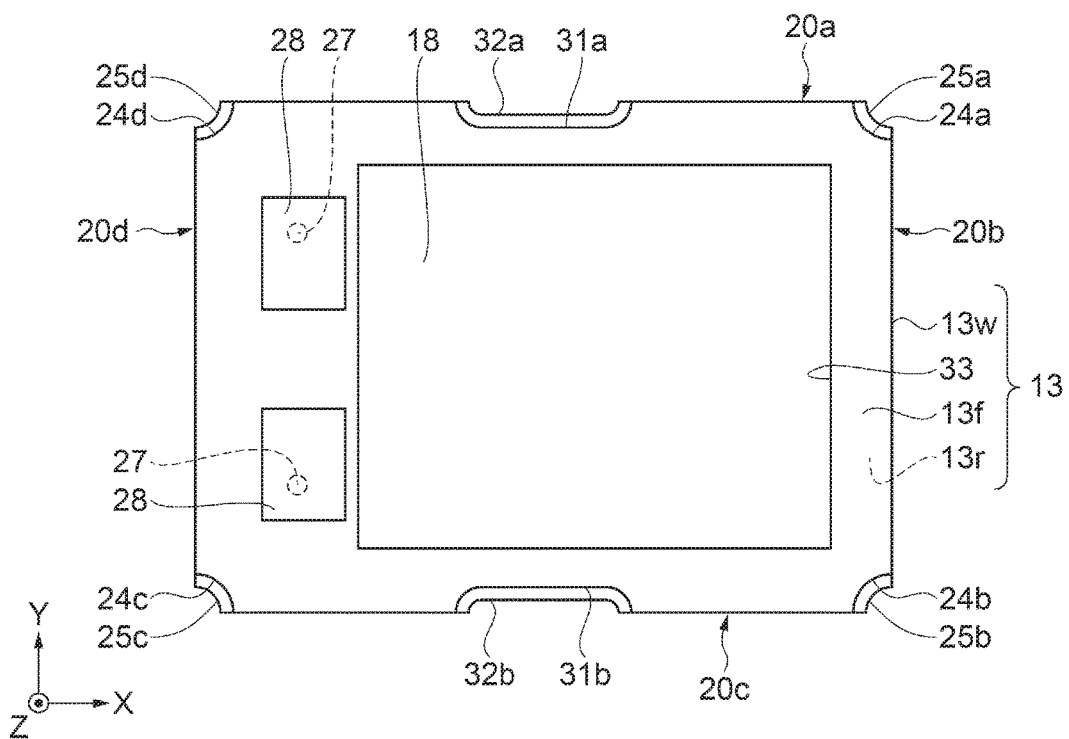
FIG. 4 is a plan view showing an electrode pattern provided on a frame plate of the electronic component package.
Figure 5:
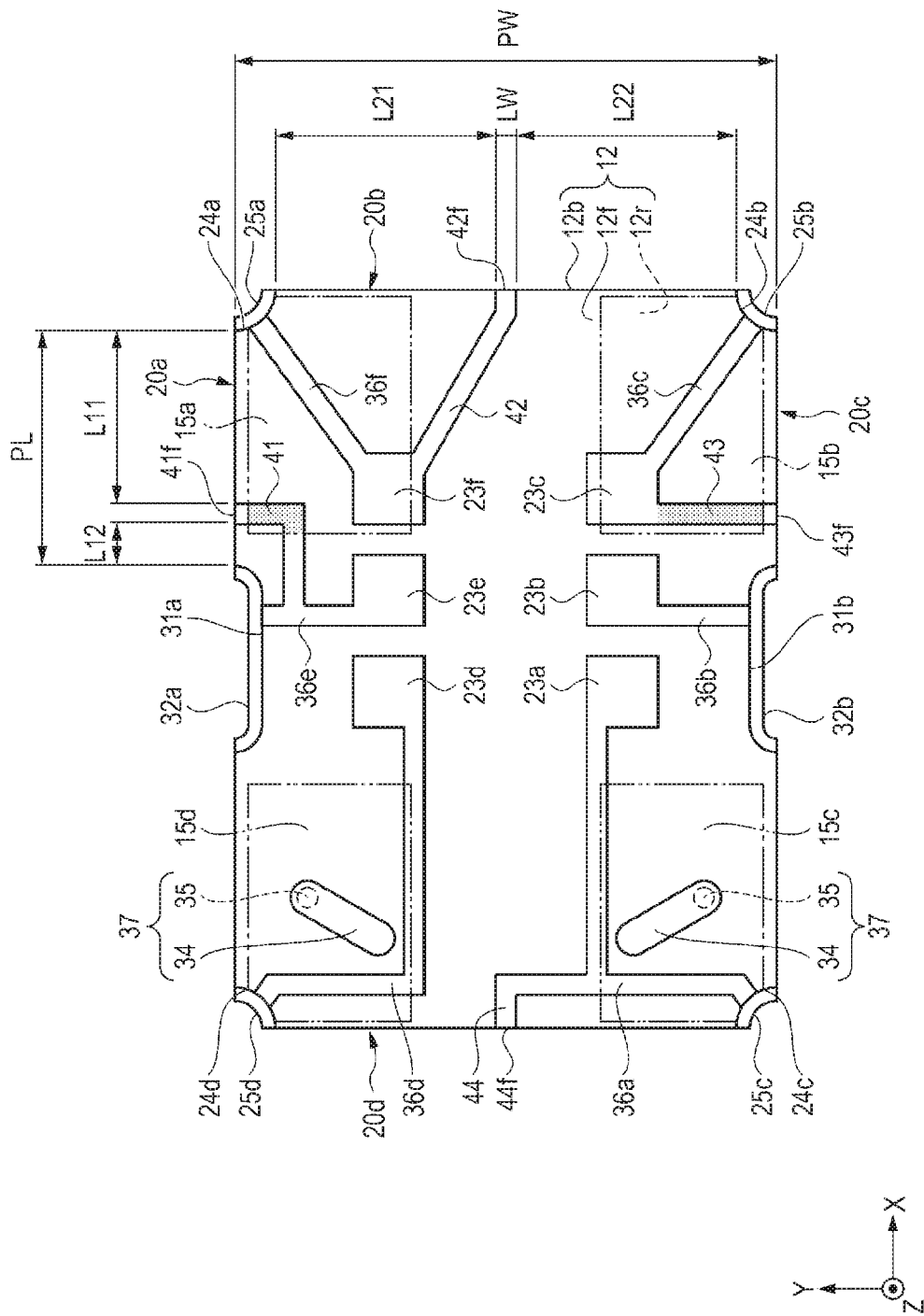
FIG. 5 is a plan view showing an electrode pattern provided on a middle plate of the electronic component package.
Figure 6:
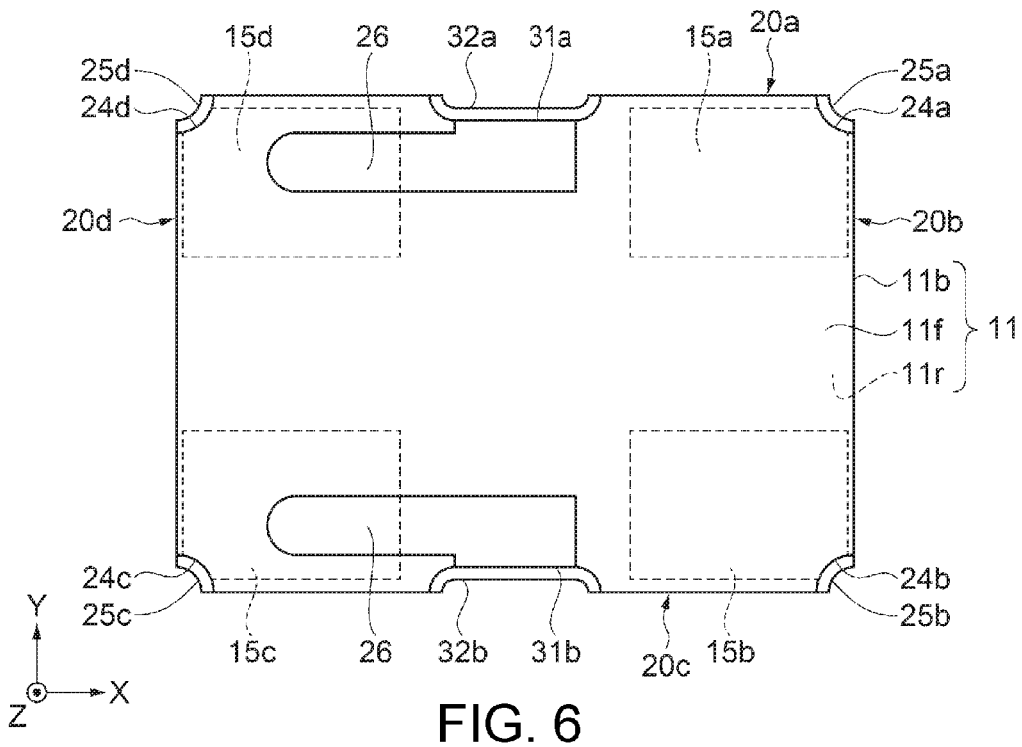
FIG. 6 is a plan view showing an electrode pattern provided on a bottom plate of the electronic component package.

Next, with reference to FIGS. 4, 5, and 6, in addition to FIGS. 1, 2, and 3, the package 20 as an electronic component package will be described. FIG. 4 is a plan view showing an electrode pattern provided on a frame plate of the electronic component package. FIG. 5 is a plan view showing an electrode pattern provided on a middle plate of the electronic component package. FIG. 6 is a plan view showing an electrode pattern provided on a bottom plate of the electronic component package.

The package 20 as an electronic component package includes a plate-like bottom plate 11, a plate-like middle plate 12 as a first substrate bonded to a front surface 11f of the bottom plate 11, a frame-like frame plate 13 bonded to the peripheral edge portion of a front surface 12f of the middle plate 12, and a frame-like side wall 14 bonded to the peripheral edge portion of a front surface 13f of the frame plate 13. The seam ring 29 used as a bonding material for bonding the lid 30 as a lid portion to be described later is provided on a front surface 14f of the side wall 14.

The package 20 includes a recess (the interior space 16) opened in the upper surface. The opening of the recess is closed by the lid 30 as a lid portion bonded to the side wall 14 via the seam ring 29 as a bonding material. The lid 30 closes the opening of the recess of the package 20 to thereby form the interior space 16 hermetically sealed. The internal pressure of the interior space 16 hermetically sealed can be set to a desired atmospheric pressure. For example, the internal pressure is set to an atmospheric pressure by charging the interior space 16 with nitrogen gas, or the interior space 16 is set to a vacuum state (the state of the space filled with a gas at a lower pressure ($1 \times 10^5$ Pa to $1 \times 10^{-10}$ Pa or less (JIS Z 8126-1: 1999)) than a normal atmospheric pressure), so that the quartz crystal resonator element 17 can continue to vibrate more stably. The interior space 16 of the embodiment is set to the above vacuum state.

As shown in FIG. 1, the outer periphery of the package 20 includes a first side surface 20a as an outside side surface (outer side surface) along the X-axis direction in the drawing, a second side surface 20b crossing the first side surface 20a, a third side surface 20c opposed to the first side surface 20a, and a fourth side surface 20d opposed to the second side surface 20b. Four recesses (a first recess 24a, a second recess 24b, a third recess 24c, and a fourth recess 24d) recessed inward from the bottom plate 11 to the side wall 14 are provided at four corners where the first side surface 20a, the second side surface 20b, the third side surface 20c, and the fourth side surface 20d cross each other. The term "cross" or "crossing" as used herein means that the surfaces are not parallel to each other (e.g., are substantially orthogonal to each other) when the surfaces extend.

Specifically, the package 20 includes the first recess 24a connecting the first side surface 20a with the second side surface 20b, the second recess 24b connecting the second side surface 20b with the third side surface 20c, the third recess 24c connecting the third side surface 20c with the fourth side surface 20d, and the fourth recess 24d connecting the fourth side surface 20d with the first side surface 20a. Recess electrodes (a first recess electrode 25a, a second recess electrode 25b, a third recess electrode 25c, and a fourth recess electrode 25d) are respectively provided inside the four recesses (the first recess 24a, the second recess 24b, the third recess 24c, and the fourth recess 24d). The recesses described above may be referred to as "castellations", and the recess electrodes described above may be referred to as "castellation electrodes".

External connection terminals as four external terminals (a first external connection terminal 15a as a first external terminal, a second external connection terminal 15b as a second external terminal, a third external connection terminal 15c as a third external terminal, and a fourth external connection terminal 15d as a fourth external terminal) are provided on the bottom surface of the package 20, that is, on a rear surface 11r of the bottom plate 11 serving as a mounting surface. The recess electrodes (the first recess electrode 25a, the second recess electrode 25b, the third recess electrode 25c, and the fourth recess electrode 25d) are respectively connected with the external connection terminals (the first external connection terminal 15a, the second external connection terminal 15b, the third external connection terminal 15c, and the fourth external connection terminal 15d) provided at corresponding positions such as, for example, the first external connection terminal 15a corresponding to the first recess electrode 25a. Here, for example, the first external connection terminal 15a as the first external terminal is an output terminal, and the second external connection terminal 15b as the second external terminal is a power supply terminal or a ground terminal.

A fifth recess 31a and a sixth recess 31b each of which is recessed inward from the bottom plate 11 to the side wall 14 are respectively provided in the first side surface 20a and the third side surface 20c of the package 20. A first side surface terminal 32a is provided inside the fifth recess 31a. A second side surface terminal 32b is provided inside the sixth recess 31b. It is desirable that the first side surface terminal 32a and the second side surface terminal 32b are provided to extend over at least the middle plate 12 and the frame plate 13. In the embodiment, the first side surface terminal 32a and the second side surface terminal 32b are disposed so as to lie over portions of the bottom plate 11 and the side wall 14. By disposing the first side surface terminal 32a and the second side surface terminal 32b as described above, the areas of the first side surface terminal 32a and the second side surface terminal 32b can be increased, and it is possible to reduce a contact failure when a probe or the like is brought into contact with the first side surface terminal 32a and the second side surface terminal 32b.

The first side surface terminal 32a and the second side surface terminal 32b may not be provided inside the fifth recess 31a and the sixth recess 31b, but may be provided to extend from the insides of the fifth recess 31a and the sixth recess 31b to the outer side surfaces (the first side surface 20a and the third side surface 20c) of the package 20 or provided on the first side surface 20a and the third side surface 20c. As shown in FIG. 4, the frame plate 13 is composed of a frame-like member 13w in which a through-hole 33 as an opening penetrating the front surface 13f on the side wall 14 side and a rear surface 13r on the side opposite to the front surface 13f is provided in the central portion of a plate-like member having a substantially rectangular shaped outer side surface in the plan view. The frame plate 13 is provided with the recesses (the first recess 24a, the second recess 24b, the third recess 24c, and the fourth recess 24d) and the recess electrodes (the first recess electrode 25a, the second recess electrode 25b, the third recess electrode 25c, and the fourth recess electrode 25d) at four corners of the outer periphery. Moreover, in the frame plate 13, the fifth recess 31a and the first side surface terminal 32a are provided on the first side surface 20a, and the sixth recess 31b and the second side surface terminal 32b are provided on the third side surface 20c. Two connection pads 28 electrically connected with the connection electrodes 19 of the quartz crystal resonator element 17 are provided on the front surface 13f of the frame plate 13 on the side wall 14 side. The quartz crystal resonator element 17 is mounted on the connection pads 28.

The frame plate 13 is provided with first interlayer wirings 27 as interlayer wirings constituting resonating element wirings 37 at positions overlapping the connection pads 28 in the plan view. The first interlayer wiring 27 herein is an electrically conducting wiring that is electrically connected with the connection pad 28 on the front surface 13f side and penetrates the frame plate 13 from the front surface 13f to the rear surface 13r. The first interlayer wiring 27 is a through-electrode also called a via, and formed by filling (charging) a through-hole penetrating the frame plate 13 from the front surface 13f to the rear surface 13r with a conductive member having favorable electrical conduction such as, for example, copper (Cu).

As shown in FIG. 5, the middle plate 12 as the first substrate forms a substantially rectangular shape in the plan view, and is composed of a plate-like member 12b including the front surface 12f located on the frame plate 13 side and a rear surface 12r on the side opposite to the front surface 12f. The middle plate 12 includes the first side surface 20a, the second side surface 20b crossing the first side surface 20a, the third side surface 20c opposed to the first side surface 20a, and the fourth side surface 20d opposed to the second side surface 20b. In addition, the middle plate 12 includes the first recess 24a connecting the first side surface 20a with the second side surface 20b, the second recess 24b connecting the second side surface 20b with the third side surface 20c, the third recess 24c connecting the third side surface 20c with the fourth side surface 20d, and the fourth recess 24d connecting the fourth side surface 20d with the first side surface 20a. The recess electrodes (the first recess electrode 25a, the second recess electrode 25b, the third recess electrode 25c, and the fourth recess electrode 25d) are respectively provided inside the four recesses (the first recess 24a, the second recess 24b, the third recess 24c, and the fourth recess 24d). The recesses (the fifth recess 31a and the sixth recess 31b) and the side surface terminals (the first side surface terminal 32a and the second side surface terminal 32b) are provided on the first side surface 20a and the third side surface 20c. Moreover, the middle plate 12 is provided with connecting electrodes 34 constituting the resonating element wirings 37 at positions respectively facing the first interlayer wirings 27 provided in the frame plate 13.

Second interlayer wirings 35 as interlayer wirings constituting the resonating element wirings 37 are provided at positions of the middle plate 12 overlapping the connecting electrodes 34 in the plan view. The second interlayer wiring 35 herein is an electrically conducting wiring that is electrically connected with the connecting electrode 34 on the front surface 12f side and penetrates the middle plate 12 from the front surface 12f to the rear surface 12r. The second interlayer wiring 35 is a through-electrode also called a via, and formed by filling (charging) a through-hole penetrating the middle plate 12 from the front surface 12f to the rear surface 12r with a conductive member having favorable electrical conduction such as, for example, copper (Cu). Although the first interlayer wiring 27 and the second interlayer wiring 35 have been described using an example in which the first interlayer wiring 27 and the second interlayer wiring 35 are electrically connected via the connecting electrode 34, the first interlayer wiring 27 and the second interlayer wiring 35 may be directly connected without providing the connecting electrode 34.

Bonding electrodes 23a, 23b, 23c, 23d, 23e, and 23f connected with connection projections (bumps) 22 of the circuit element 21 are provided on the front surface 12f of the middle plate 12 located inside the through-hole 33 of the frame plate 13. The bonding electrodes 23a, 23b, 23c, 23d, 23e, and 23f are electrically connected with the recess electrodes (the first recess electrode 25a, the second recess electrode 25b, the third recess electrode 25c, and the fourth recess electrode 25d) and the side surface terminals (the first side surface terminal 32a and the second side surface terminal 32b). The circuit element 21 is disposed to face the bonding electrodes 23a, 23b, 23c, 23d, 23e, and 23f, and mounted on the middle plate 12. Although the bonding electrodes 23a, 23b, 23c, 23d, 23e, and 23f are connected with the connection projections (bumps) 22 in the embodiment, the connection method of the bonding electrodes 23a, 23b, 23c, 23d, 23e, and 23f with the circuit element 21 is not limited to this. For example, the bonding electrodes 23a, 23b, 23c, 23d, 23e, and 23f may be electrically connected with the circuit element 21 by wire bonding.

Specifically, the bonding electrode 23a is connected to the third recess electrode 25c with a wiring electrode 36a. The wiring electrode 36a includes a fourth branch wiring 44 branching off from the wiring electrode 36a. The fourth branch wiring 44 includes a fourth end 44f exposed in the fourth side surface 20d. The bonding electrode 23b is connected to the second side surface terminal 32b with a wiring electrode 36b. The bonding electrode 23c is connected to the second recess electrode 25b with a wiring electrode 36c. The bonding electrode 23c includes a third branch wiring 43. The third branch wiring 43 includes a third end 43f exposed in the third side surface 20c. The bonding electrode 23d is connected to the fourth recess electrode 25d with a wiring electrode 36d. The bonding electrode 23e is connected to the first side surface terminal 32a with a wiring electrode 36e.

The wiring electrode 36e includes a first branch wiring 41 branching off from the wiring electrode 36e. The first branch wiring 41 includes a first end 41f exposed in the first side surface 20a. In other words, the first branch wiring 41 is electrically connected with the first side surface terminal 32a. Since the first branch wiring 41 is electrically connected with the first side surface terminal 32a as described above, it does not matter if the first side surface terminal 32a and the first end 41f contact with each other on the first side surface 20a. Therefore, the first side surface terminal 32a and the first end 41f can be close to each other. As a result, the first side surface terminal 32a can be disposed at a position farther away from the first recess electrode 25a, and it is possible to reduce the risk of occurrence of an electrical short circuit (short) between the first end 41f and the first recess electrode 25a due to solder or the like creeping up the first recess electrode 25a at the time of mounting on a circuit board or the like.

The bonding electrode 23f is connected to the first recess electrode 25a with a wiring electrode 36f. The bonding electrode 23f includes a second branch wiring 42. The second branch wiring 42 includes a second end 42f exposed in the second side surface 20b.

Here, the first branch wiring 41, the second branch wiring 42, the third branch wiring 43, and the fourth branch wiring 44 are each a wiring whose one end is connected to a signal wiring, such as a wiring electrically conducted to the quartz crystal resonator element 17 or a wiring electrically conducted to the circuit element 21, or a pad, and whose other end is electrically floating, and are each a wiring used as, for example, an electrically conducting wiring when performing an electroplating process of the bonding electrodes 23e, 23f, 23c, and 23a.

It is preferable that the position of the first end 41f of the first branch wiring 41 exposed in the first side surface 20a described above satisfies the relation: L11>L12 where L11 is the distance between the first end 41f and the first recess electrode 25a and L12 is the distance between the first end 41f and the first side surface terminal 32a, when the front surface 12f of the middle plate 12 is viewed in a plan view. The term "distance" as used herein means the shortest distance between objects.

By making the distance (L11) between the first end 41f and the first recess electrode 25a larger than the distance (L12) between the first end 41f and the first side surface terminal 32a as described above, the position of the first end 41f with respect to the first recess electrode 25a is disposed at a position farther than the intermediate position from the first side surface terminal 32a to the first recess electrode 25a. In other words, the position of the first end 41f is disposed at a position closer to the first side surface terminal 32a side, where the creeping up of solder or the like is less likely to occur, than the intermediate position from the first side surface terminal 32a to the first recess electrode 25a. Hence, it is possible to reduce the risk of occurrence of an electrical short circuit (short) between the first end 41f and the first recess electrode 25a due to solder or the like creeping up the first recess electrode 25a at the time of mounting on a circuit board or the like, and the package 20 with high reliability can be obtained.

Moreover, it is preferable that L11, which is the distance between the first end 41f and the first recess electrode 25a, satisfies the relation: $0.15 \text{ mm} \leq L11 < PL$ where PL is the distance between the first recess electrode and the first side surface terminal.

When L11 is set as described above, the position of the first end 41f of the first branch wiring 41 is located between the first recess electrode 25a and the first side surface terminal 32a and the distance (L11) between the first end 41f and the first recess electrode 25a is 0.15 mm or more. Since the first end 41f is disposed at a distance of 0.15 mm or more from the first recess electrode 25a as described above, the first branch wiring 41 can be easily formed.

Moreover, it is preferable that L12, which is the distance between the first end 41f of the first branch wiring 41 and the first side surface terminal 32a, satisfies the relation: $0.15 \text{ mm} \leq L12 < (L11+L12)/2$.

When L12 is set as described above, the distance (L12) between the first end 41f of the first branch wiring 41 and the first side surface terminal 32a is less than (L11+L12)/2 and 0.15 mm or more. That is, the position of the first end 41f is disposed at a distance of 0.15 mm or more from the first side surface terminal 32a and at a position closer to the first side surface terminal 32a than the middle between the first recess electrode 25a and the first side surface terminal 32a with the first end 41f therebetween. Therefore, the distance between the first recess electrode 25a and the first end 41f can be sufficiently provided. With this configuration, it is possible to reduce the risk of occurrence of an electrical short circuit (short) between the first end 41f and the first recess electrode 25a due to solder or the like creeping up the first recess electrode 25a at the time of mounting on a circuit board or the like, and the first branch wiring 41 can be easily formed. Moreover, it is preferable to satisfy the relation: $L21-L22 \leq LW$ where L21 is the distance between the second end 42f of the second branch wiring 42 and the first recess electrode 25a, L22 is the distance between the second end 42f and the second recess electrode 25b, and LW is the width dimension of the second end 42f.

By disposing the second end 42f as described above, the second end 42f is located in the second side surface 20b between the first recess electrode 25a and the second recess electrode 25b and disposed substantially in the middle between the first recess electrode 25a and the second recess electrode 25b. That is, by separating the second end 42f substantially equally from the first recess electrode 25a and the second recess electrode 25b located on both sides, it is possible to reduce the risk of occurrence of an electrical short circuit (short) between the second end 42f and each of the first recess electrode 25a and the second recess electrode 25b due to solder or the like creeping up the first recess electrode 25a and the second recess electrode 25b.

Moreover, it is preferable that L21, which is the distance between the second end 42f of the second branch wiring 42 and the first recess electrode 25a, satisfies the relations: 0.15 mm≤L21≤PW/2 and 0.15 mm≤L22≤PW/2 where PW is the width dimension of the second side surface 20b in a direction (direction along the Y-axis direction in the drawing) in which the first recess electrode 25a, the second recess electrode 25b, and the second end 42f are arranged.

By doing this, since the distance (L21, L22) between the second end 42f of the second branch wiring 42 and the first recess electrode 25a or the second recess electrode 25b is half or less of the distance (PW being the width dimension of the second side surface 20b) between the first recess electrode 25a and the second recess electrode 25b and is 0.15 mm or more, the second branch wiring 42 can be easily formed and also it is possible to reduce the risk of occurrence of an electrical short circuit (short) between the second end 42f and the first recess electrode 25a or the second recess electrode 25b due to solder or the like creeping up the first recess electrode 25a or the second recess electrode 25b at the time of mounting on a circuit board or the like.

It is preferable that the area of an overlapping portion (shown by hatching in the drawing) of the first external connection terminal 15a (first external terminal) as an output terminal provided on the rear surface 11r of the bottom plate 11 serving as the bottom surface of the package 20 and the first branch wiring 41 in the plan view is smaller than the area of an overlapping portion (shown by hatching in the drawing) of the second external connection terminal 15b (second external terminal) as a power supply terminal or a ground terminal provided on the rear surface 11r of the bottom plate 11 serving as the bottom surface of the package 20 and the third branch wiring 43 in the plan view.

According to the configuration described above, by making smaller the area of the overlapping portion of the first branch wiring 41 and the first external connection terminal 15a as an output terminal in the plan view, characteristic degradation due to the influence of capacitive coupling relating to the output terminal can be reduced. The characteristics of the power supply terminal or the ground terminal are not affected even when the power supply terminal or the ground terminal overlaps the third branch wiring 43 in the plan view.

As shown in FIG. 6, the bottom plate 11 forms a substantially rectangular shape in the plan view, and is composed of a plate-like member 11b including the front surface 11f located on the middle plate 12 side and the rear surface 11r as amounting surface of the package 20 located on the side opposite to the front surface 11f. The bottom plate 11 is provided with the recesses (the first recess 24a, the second recess 24b, the third recess 24c, and the fourth recess 24d) and the recess electrodes (the first recess electrode 25a, the second recess electrode 25b, the third recess electrode 25c, and the fourth recess electrode 25d) at four corners of the outer periphery. Moreover, in the bottom plate 11, the fifth recess 31a and the first side surface terminal 32a are provided on the first side surface 20a, and the sixth recess 31b and the second side surface terminal 32b are provided on the third side surface 20c. Terminal wirings 26 constituting the resonating element wirings 37 are provided on the front surface 11f of the bottom plate 11.

The terminal wiring 26 is provided in a band shape from a position facing the second interlayer wiring 35 provided in the middle plate 12 to extend over the first side surface terminal 32a or the second side surface terminal 32b. Since the terminal wiring 26 is connected to the first side surface terminal 32a or the second side surface terminal 32b, the two connection pads 28 electrically connected with the connection electrodes 19 of the quartz crystal resonator element 17 are electrically connected with the first side surface terminal 32a and the second side surface terminal 32b via the resonating element wirings 37 respectively corresponding to the two connection pads 28. In other words, the terminal wiring 26 is disposed between the bottom plate 11 and the middle plate 12 and connected with the first side surface terminal 32a or the second side surface terminal 32b.

The terminal wiring 26 is not limited to the configuration of the wiring pattern extending mainly in one direction as described above. For example, the terminal wiring 26 may have a wiring pattern in which a wiring in a band shape has a bent-like or wave-like curve, or a wiring pattern in a bent band shape having two extending directions crossing each other.

The external connection terminals as the four external terminals (the first external connection terminal 15a as the first external terminal, the second external connection terminal 15b as the second external terminal, the third external connection terminal 15c as the third external terminal, and the fourth external connection terminal 15d as the fourth external terminal) corresponding to the respective recesses (the first recess 24a, the second recess 24b, the third recess 24c, and the fourth recess 24d) are provided on the rear surface 11r (mounting surface) of the bottom plate 11 serving as the bottom surface of the package 20. The first external connection terminal 15a is connected with the first recess electrode 25a corresponding thereto. The second external connection terminal 15b is connected with the second recess electrode 25b corresponding thereto. The third external connection terminal 15c is connected with the third recess electrode 25c corresponding thereto. The fourth external connection terminal 15d is connected with the fourth recess electrode 25d corresponding thereto. In the embodiment, the first external connection terminal 15a is an output terminal, and the second external connection terminal 15b is a power supply terminal or a ground terminal. By providing the recess electrodes (the first recess electrode 25a, the second recess electrode 25b, the third recess electrode 25c, and the fourth recess electrode 25d) connected with the external connection terminals (the first external connection terminal 15a, the second external connection terminal 15b, the third external connection terminal 15c, and the fourth external connection terminal 15d), for example it is easy to form the creeping up of solder (solder fillet) and thus mounting reliability can be improved when mounting the package 20.

The side wall 14 bonded on the front surface 13f side of the frame plate 13 includes an opening including an open end outside the opening of the frame plate 13 in the X-axis direction and the Y-axis direction. The side wall 14 is provided in a substantially rectangular frame shape disposed along the outer peripheral edge (outside portion) on the upper portion (the front surface 13f of the frame plate 13) of the package 20 in which the plates from the bottom plate 11 to the frame plate 13 are stacked. In other words, the opening shape of the side wall 14 opened in the upper surface of the recess of the package 20 forms a substantially rectangular circumferential shape; the side wall 14 includes the front surface 14f and a rear surface 14r on the side opposite to the front surface 14f; and the rear surface 14r is bonded to the front surface 13f of the frame plate 13.

The seam ring 29 formed of an alloy such as, for example, Kovar is provided on the front surface 14f of the frame-like side wall 14 on the side opposite to the frame plate 13 side. The seam ring 29 has a function as a bonding material between the lid 30 as a lid portion and the side wall 14, and is provided in a frame shape (substantially rectangular circumferential shape) along the front surface 14f of the side wall 14. The package 20 is formed of a material having a thermal expansion coefficient identical with or very close to the thermal expansion coefficient of the quartz crystal resonator element 17, the circuit element 21, and the lid 30, and ceramic is used in the example. The package 20 is formed by stacking and sintering green sheets shaped in a predetermined shape. The green sheet is obtained by dispersing ceramic powder in, for example, a predetermined solution, adding a binder thereto to generate a kneaded material, and then forming the kneaded material into a sheet shape.

The electrodes and the wirings, such as the external connection terminals (the first external connection terminal 15a, the second external connection terminal 15b, the third external connection terminal 15c, and the fourth external connection terminal 15d), the recess electrodes (the first recess electrode 25a, the second recess electrode 25b, the third recess electrode 25c, and the fourth recess electrode 25d), the terminal wiring 26, the connection pad 28, the side surface terminals (the first side surface terminal 32a and the second side surface terminal 32b), the connecting electrode 34, the bonding electrodes 23a, 23b, 23c, 23d, 23e, and 23f, the wiring electrodes 36a, 36b, 36c, 36d, 36e, and 36f, and the branch wirings (the first branch wiring 41, the second branch wiring 42, the third branch wiring 43, and the fourth branch wiring 44), can be formed of, for example, tungsten or the like. For example, these electrodes, wirings, and the like can be formed by forming a required shape (pattern) using tungsten metallization or the like, then performing sintering, and thereafter plating nickel, gold, silver, or the like. In addition to the tungsten metallization described above, for example a conductive paste containing silver, palladium, or the like as a base compound can be used for these electrodes, wirings, and the like. In this case, these electrodes, wirings, and the like can be formed by forming a required shape using the conductive paste and then performing a curing (drying) process. Moreover, these electrodes, wirings, and the like can be formed using other forming methods such as a sputtering method or an evaporation method using, for example, tungsten or the like.

Moreover, the arrangements and the numbers of the external connection terminals (the first external connection terminal 15a, the second external connection terminal 15b, the third external connection terminal 15c, and the fourth external connection terminal 15d), the recess electrodes (the first recess electrode 25a, the second recess electrode 25b, the third recess electrode 25c, and the fourth recess electrode 25d), the terminal wiring 26, the connection pad 28, the side surface terminals (the first side surface terminal 32a and the second side surface terminal 32b), the connecting electrode 34, the bonding electrodes 23a, 23b, 23c, 23d, 23e, and 23f, the wiring electrodes 36a, 36b, 36c, 36d, 36e, and 36f, the branch wirings (the first branch wiring 41, the second branch wiring 42, the third branch wiring 43, and the fourth branch wiring 44), and the like are not limited to those of the embodiment described above.

Circuit Element

The circuit element 21 is connected while making electrical connection to the bonding electrodes 23a, 23b, 23c, 23d, 23e, and 23f provided on the front surface 11f of the bottom plate 11 via the connection projections (bumps) 22. The circuit element 21 includes, for example, at least the oscillation circuit causing the quartz crystal resonator element 17 to oscillate or a circuit (temperature compensation circuit) having characteristics opposite to the temperature characteristics of the quartz crystal resonator element 17.

Lid

The lid 30 as a lid portion is a plate-like member, closes the opening of the recess opened in the upper surface of the package 20, and forms the interior space 16. The lid 30 is bonded via the seam ring 29 as a bonding material to the periphery of the opening of the recess corresponding to the front surface 14f of the side wall 14 using, for example, a seam welding method or the like. Since the lid 30 in the example is plate-like, the lid 30 is easily formed and, in addition, has excellent shape stability. A plate material of Kovar having conductivity is used for the lid 30 in the example.

By using a Kovar plate for the lid 30, the seam ring 29 and the lid 30, which are formed of Kovar, are melted in the same melted state in sealing and, in addition, are easily alloyed. Therefore, sealing can be easily and reliably performed. Moreover, by using a plate material having conductivity for the lid 30, the lid 30 can be set at a fixed potential and thus a shielding effect can be provided for the lid 30. With this configuration, electrical noise incident from the lid 30 side can be prevented. A plate material of other materials may be used instead of Kovar for the lid 30. For example, a metal material such as Alloy 42 or stainless steel, or the same material as that of the side wall 14 of the package 20 can be used.

According to the oscillator 1 as an electronic component using the package 20 as an electronic component package according to the embodiment described above, by making the distance (L11) between the first end 41f of the first branch wiring 41 and the first recess electrode 25a larger than the distance (L12) between the first end 41f and the first side surface terminal 32a, the position of the first end 41f with respect to the first recess electrode 25a is disposed at a position farther than the intermediate position from the first side surface terminal 32a to the first recess electrode 25a. In other words, the position of the first end 41f is disposed at a position closer to the first side surface terminal 32a side, where the creeping up of solder or the like is less likely to occur, than the intermediate position from the first side surface terminal 32a to the first recess electrode 25a. Hence, it is possible to reduce the risk of occurrence of an electrical short circuit (short) between the first end 41f and the first recess electrode 25a due to solder or the like creeping up the first recess electrode 25a at the time of mounting on a circuit board or the like.

In the embodiment described above, the description has been made using quartz crystal as the piezoelectric material forming the quartz crystal resonator element 17. However, the piezoelectric material is not limited to this, and a piezoelectric material such as, for example, lithium tantalate or lithium niobate can be used. Moreover, the quartz crystal resonator element 17 may have a configuration using a micro-electro-mechanical systems (MEMS) element in which a resonating element is formed on a silicon or glass substrate. Moreover, the quartz crystal resonator element 17 may be a resonating element having a configuration in which a resonating body is formed on a substrate such as a silicon or glass substrate.

In the embodiment, the oscillator 1 using the quartz crystal resonator element 17 has been described as one example of the electronic component to which the package 20 according to the invention is applied. However, the invention is not limited to this, and for example, the package 20 can be applied to an electronic component having other functions such as a sensor incorporating a sensor element such as for acceleration or angular velocity.

Electronic Apparatus

Figure 7:
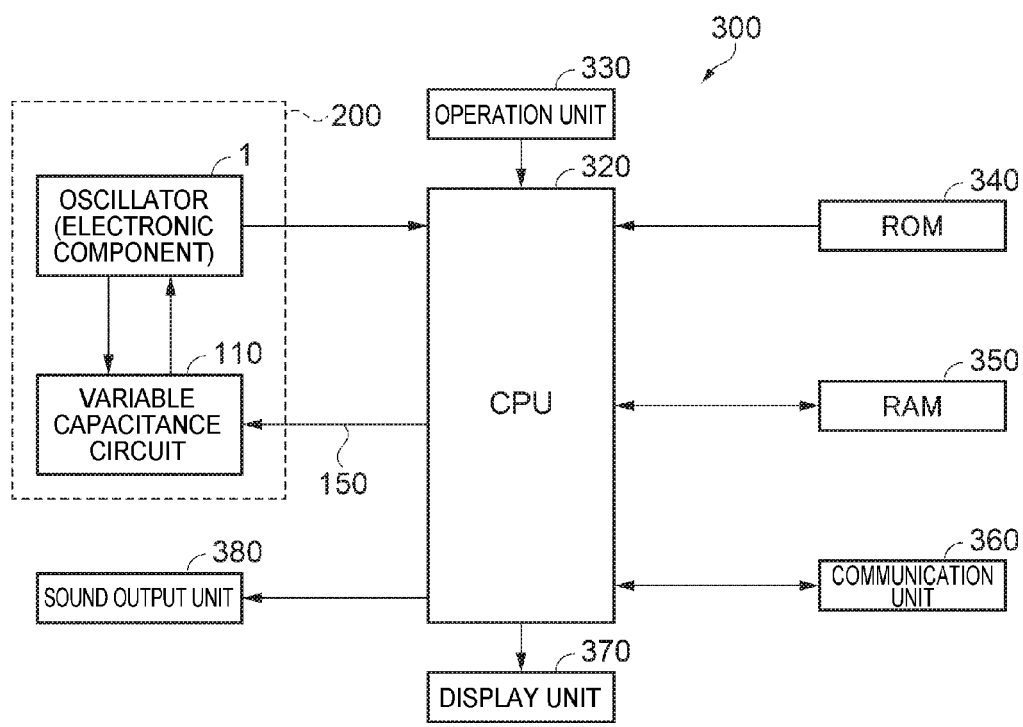
FIG. 7 is a functional block diagram showing one configuration example of an electronic apparatus including the electronic component using the electronic component package.
Figure 8:
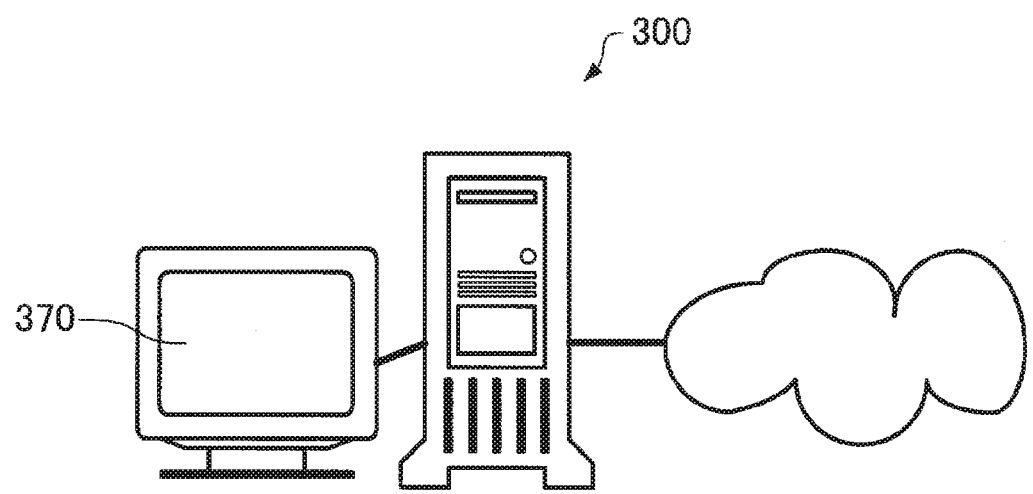
FIG. 8 is a schematic view showing a configuration example of a network server as one example of the electronic apparatus including the electronic component using the electronic component package.
Figure 9:
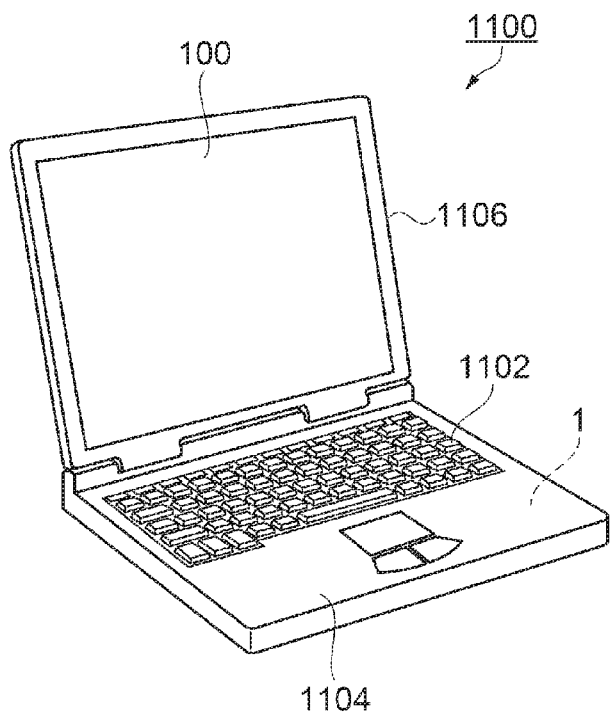
FIG. 9 is a perspective view showing the configuration of a mobile personal computer as one example of the electronic apparatus including the electronic component using the electronic component package.
Figure 10:
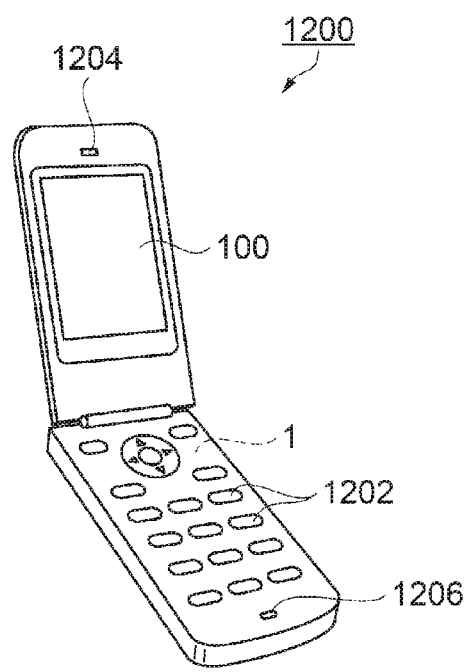
FIG. 10 is a perspective view showing the configuration of a mobile phone as one example of the electronic apparatus including the electronic component using the electronic component package.
Figure 11:
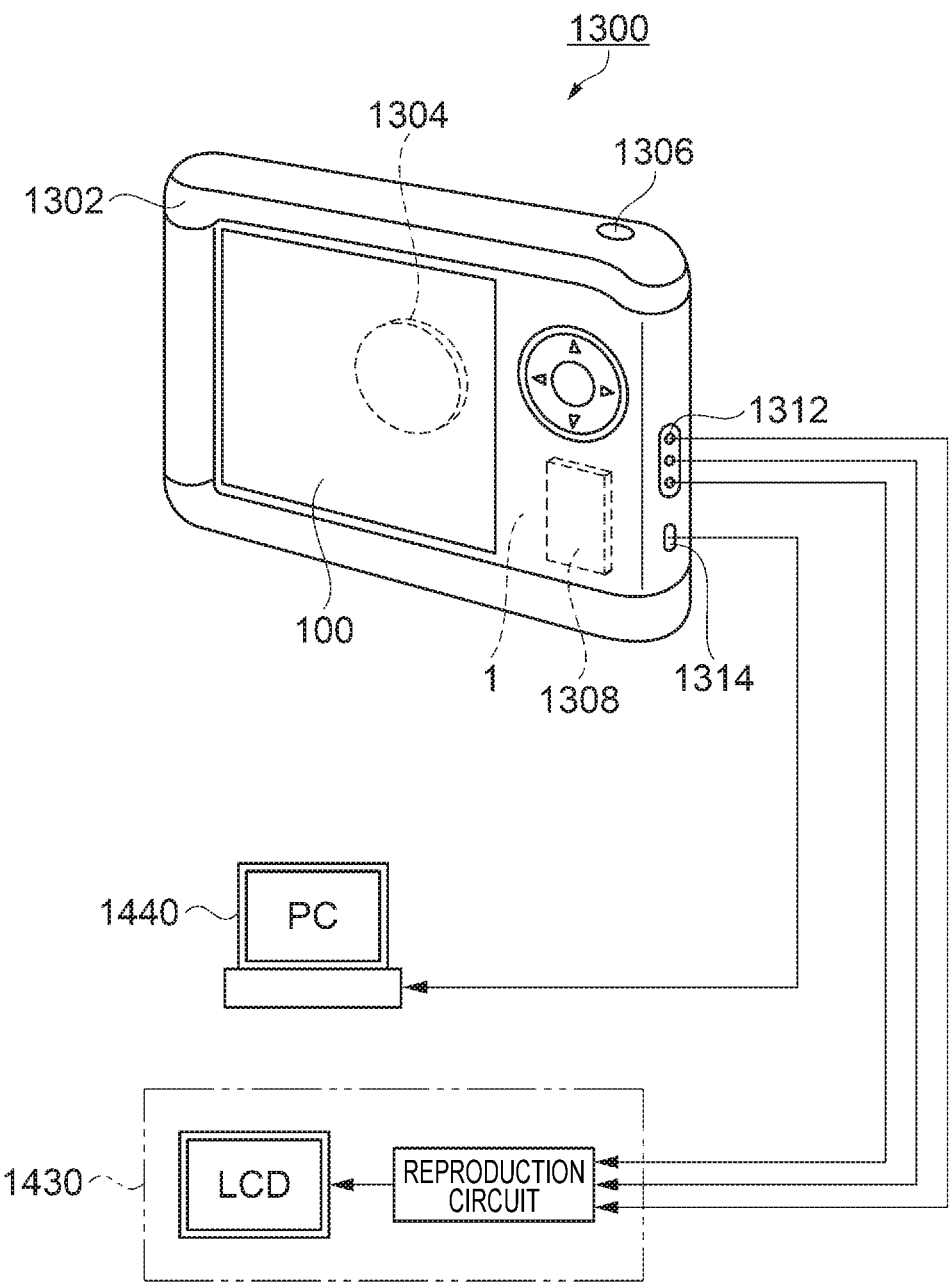
FIG. 11 is a perspective view showing the configuration of a digital still camera as one example of the electronic apparatus including the electronic component using the electronic component package.

Next, electronic apparatuses to which the oscillator 1 as an electronic component using the electronic component package according to the invention is applied will be described in detail with reference to FIGS. 7, 8, 9, 10, and 11. FIG. 7 is a functional block diagram showing one configuration example of an electronic apparatus including the electronic component using the electronic component package. FIG. 8 is a schematic view showing a configuration example of a network server as one example of the electronic apparatus including the electronic component using the electronic component package. FIG. 9 is a perspective view showing the configuration of a mobile personal computer as one example of the electronic apparatus including the electronic component using the electronic component package. FIG. 10 is a perspective view showing the configuration of a mobile phone as one example of the electronic apparatus including the electronic component using the electronic component package. FIG. 11 is a perspective view showing the configuration of a digital still camera as one example of the electronic apparatus including the electronic component using the electronic component package. In FIG. 11, connections with external apparatuses are also shown in a simplified manner.

In the following description, an example is shown, in which the oscillator 1 including the quartz crystal resonator element 17 and the circuit element 21 of the embodiment described above is applied as the electronic component using the electronic component package to an electronic apparatus. The same constituent elements as those of FIGS. 1 to 6 illustrating the oscillator 1 described above are denoted by the same reference numerals and signs, and the description of the same constituent elements is omitted.

First, specific examples of the electronic apparatus to which the oscillator 1 according to the embodiment described above is applied will be described with reference to FIGS. 7 and 8. An electronic apparatus 300 shown in FIG. 7 is configured to include an electronic component 200 including the oscillator 1 as an electronic component and a variable capacitance circuit 110, a central processing unit (CPU) 320, an operation unit 330, a read only memory (ROM) 340, a random access memory (RAM) 350, a communication unit 360, a display unit 370, and a sound output unit 380. In the electronic apparatus 300, a portion of the constituent elements (units) in FIG. 7 may be omitted or modified, or other constituent elements may be added. The electronic component 200 includes the variable capacitance circuit 110 and the oscillator 1, and supplies a clock signal from the oscillator 1, not only to the CPU 320, but also to the units (illustration is omitted).

The CPU 320 performs various calculation processes or control processes, according to programs stored in the ROM 340 or the like, using the clock signal output by the electronic component 200. Specifically, the CPU 320 performs various processes in response to an operation signal from the operation unit 330, a process for controlling the communication unit 360 to perform data communication with the outside, a process for transmitting a display signal for causing the display unit 370 to display various information, a process for causing the sound output unit 380 to output various sounds, and the like.

The operation unit 330 is an input device composed of an operation key, a button switch, and the like, and outputs an operation signal in response to a user's operation to the CPU 320.

The ROM 340 stores programs, data, and the like for the CPU 320 to perform various calculation processes or control processes.

The RAM 350 is used as a working area of the CPU 320, and temporarily stores programs or data read from the ROM 340, data input from the operation unit 330, the results of operations executed by the CPU 320 according to the various programs, and the like.

The communication unit 360 performs various controls for establishing data communication between the CPU 320 and an external device.

The display unit 370 is a display device composed of a liquid crystal display (LCD) or the like, and displays various information based on the display signal input from the CPU 320. The sound output unit 380 is a device that outputs sounds, such as a speaker.

The electronic apparatus 300 can adjust setting data of the variable capacitance circuit 110 with a control signal 150 of the CPU 320. Therefore, even if the oscillation frequency of the clock signal is shifted, the oscillation frequency can be easily adjusted.

FIG. 8 is a diagram showing one example of an external appearance of a network server as one example of the electronic apparatus 300. The network server as the electronic apparatus 300 includes an LCD as the display unit 370. In the network server as the electronic apparatus 300, the setting data of the variable capacitance circuit 110 can be adjusted with the control signal 150. Therefore, even if the oscillation frequency of the clock signal is shifted, the oscillation frequency can be easily adjusted. As a result, an accurate clock signal can be used, and thus reliability is increased. As described above, since the oscillator 1 with high reliability in which the risk of occurrence of the electrical short circuit (short) is reduced as described in the above embodiment is utilized for the electronic apparatus 300 and the network server as one example of the electronic apparatus 300, it is possible to provide the electronic apparatus 300 and the network server as one example of the electronic apparatus 300 both having higher reliability.

Next, other specific examples of the electronic apparatus to which the oscillator 1 according to the embodiment described above is applied will be described in detail with reference to FIGS. 9 to 11.

As shown in FIG. 9, a personal computer 1100 is composed of a main body portion 1104 including a keyboard 1102, and a display unit 1106 including a display portion 100. The display unit 1106 is rotatably supported with respect to the main body portion 1104 via a hinge structure portion. The oscillator 1 having a function as a signal processing timing source is incorporated into the personal computer 1100.

As shown in FIG. 10, a mobile phone 1200 includes a plurality of operation buttons 1202, an earpiece 1204, and a mouthpiece 1206. The display portion 100 is disposed between the operation buttons 1202 and the earpiece 1204. The oscillator 1 having the function as the signal processing timing source is incorporated into the mobile phone 1200.

As shown in FIG. 11, in a digital still camera 1300, the display portion 100 is provided on the back surface of a case (body) 1302 and configured to perform display based on an imaging signal generated by a charge coupled device (CCD).

The display portion 100 functions as a finder that displays a subject as an electronic image. On the front surface side (the rear surface side in the drawing) of the case 1302, a light receiving unit 1304 including an optical lens (imaging optical system) and the CCD is provided.

Here, in a related-art film camera, a silver halide photographic film is exposed to light with an optical image of a subject; while the digital still camera 1300 generates an imaging signal (image signal) by performing photoelectric conversion of an optical image of a subject using an imaging element such as the CCD.

When a photographer checks a subject image displayed on the display portion 100 and presses a shutter button 1306, an imaging signal of the CCD at that time is transferred and stored in a memory 1308. In the digital still camera 1300, a video signal output terminal 1312 and an input/output terminal for data communication 1314 are provided on the side surface of the case 1302. In addition, as shown in the drawing, a television monitor 1430 and a personal computer 1440 are connected as necessary to the video signal output terminal 1312 and the input/output terminal for data communication 1314, respectively. Further, the imaging signal stored in the memory 1308 is output to the television monitor 1430 or the personal computer 1440 by a predetermined operation. The oscillator 1 having the function as the signal processing timing source is incorporated into the digital still camera 1300.

As described above, since the oscillator 1 with high reliability in which the risk of occurrence of the electrical short circuit (short) is reduced as described in the above embodiment is utilized for the personal computer 1100, the mobile phone 1200, and the digital still camera 1300 as the electronic apparatuses, it is possible to provide the personal computer 1100, the mobile phone 1200, and the digital still camera 1300 as the electronic apparatuses having higher reliability.

The oscillator 1 as the electronic component using the electronic component package can be applied to, in addition to the personal computer (mobile personal computer) in FIG. 9, the mobile phone in FIG. 10, and the digital still camera in FIG. 11, electronic apparatuses such as, for example, an inkjet-type discharge apparatus (e.g., an inkjet printer), a laptop personal computer, a television set, a video camcorder, a video tape recorder, a car navigation system, a pager, an electronic notebook (including that with a communication function), an electronic dictionary, a calculator, an electronic gaming machine, a word processor, a workstation, a videophone, a surveillance TV monitor, electronic binoculars, a POS terminal, a medical device (e.g., an electronic thermometer, a sphygmomanometer, a blood glucose meter, an electrocardiogram measuring system, an ultrasonic diagnosis apparatus, and an electronic endoscope), a fishfinder, various measuring instruments, gauges (e.g., gauges used in a vehicle, an airplane, and a ship), a flight simulator, a head-mounted display, a motion trace, motion tracking, a motion controller, and a pedestrian dead reckoning (PDR). Using the oscillator 1 or the like described above is suitable for an electronic apparatus used under the conditions where a temperature change is large, such as in a communication base station, because the oscillator 1 or the like has a temperature compensation function.

Vehicle

Figure 12:
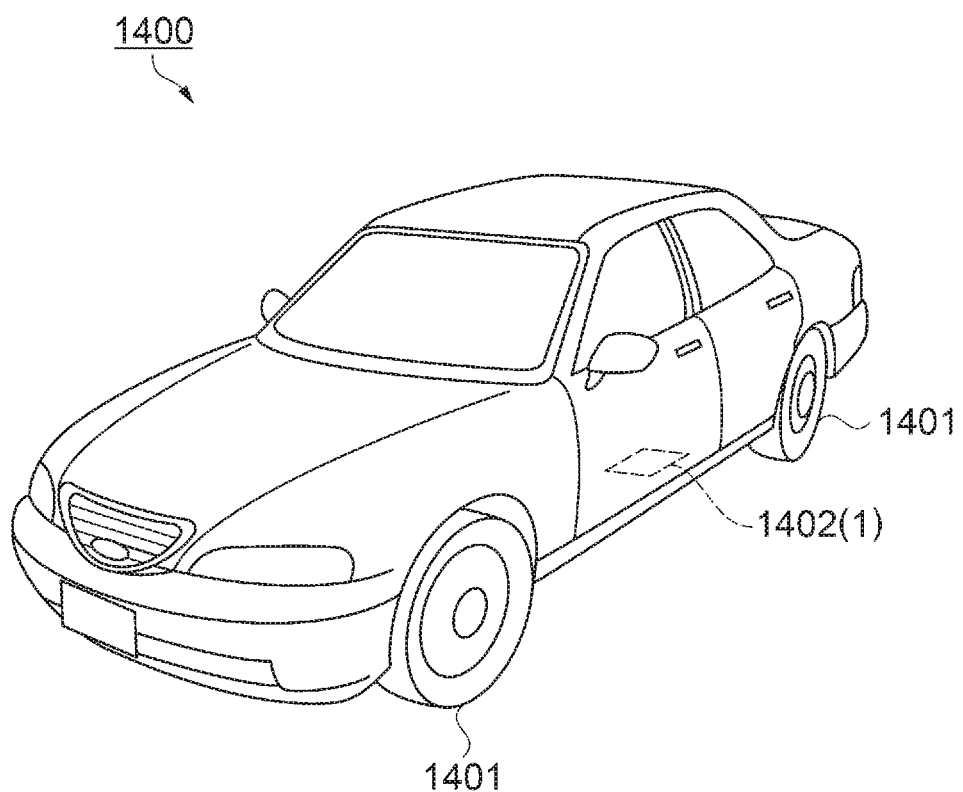
FIG. 12 is a perspective view showing the configuration of an automobile as a vehicle including the electronic component using the electronic component package.

Next, a vehicle to which the oscillator 1 including the quartz crystal resonator element 17 and the circuit element 21 of the embodiment described above is applied as the electronic component using the electronic component package will be described with reference to FIG. 12. FIG. 12 is a perspective view showing the configuration of an automobile as a vehicle including the electronic component using the electronic component package.

A gyro sensor configured to include the oscillator 1 is mounted in the automobile 1400. For example, as shown in the drawing, an electronic control unit (ECU) 1402 into which the gyro sensor to control tires 1401 is mounted in the automobile 1400 as a vehicle. As other examples, the oscillator 1 can be widely applied to ECUs such as of a keyless entry system, an immobilizer, a car navigation system, a car air-conditioner, an anti-lock brake system (ABS), an air bag, a tire pressure monitoring system (TPMS), an engine control unit, a brake system, battery monitors for a hybrid automobile and an electronic automobile, and a vehicle body attitude control system, and an advanced driver assistance system (ADAS) (automatic driving system).

As described above, since the oscillator 1 with high reliability in which the risk of occurrence of the electrical short circuit (short) is reduced as described in the above embodiment is utilized for the automobile 1400 as a vehicle, it is possible to provide the vehicle (the automobile 1400) having higher reliability.

The electronic apparatus and vehicle to which the oscillator 1 as the electronic component using the electronic component package according to the invention is applied have been described above based on the embodiments shown in the drawings. However, the invention is not limited to the embodiments, but the configuration of each part can be replaced with any configuration having a similar function. Moreover, any other configurations may be added to the invention. Moreover, the embodiments described above may be appropriately combined together.

Base Station Device

Figure 13:
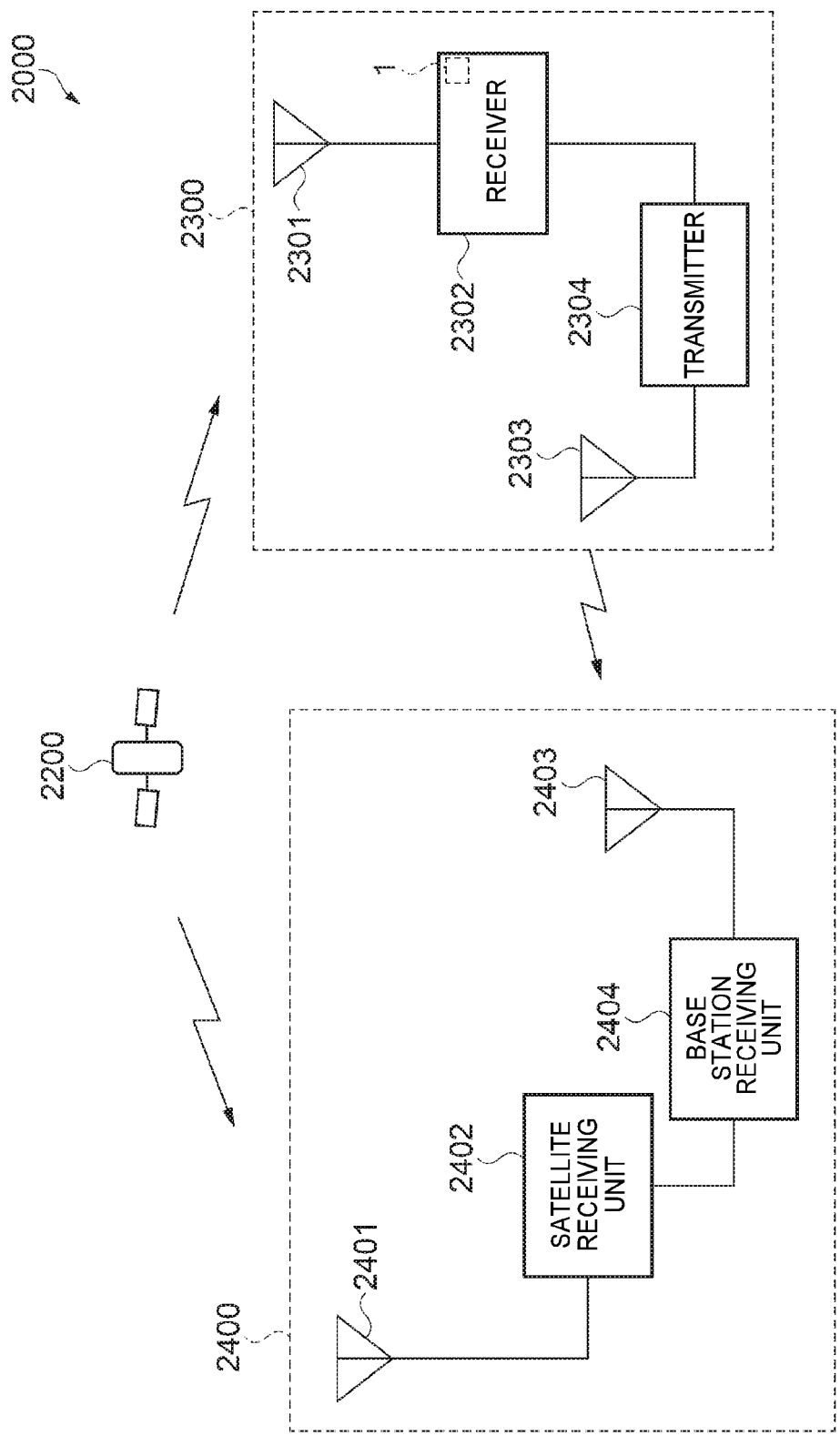
FIG. 13 is a functional block diagram showing a configuration example of a positioning system to which a base station device including the electronic component using the electronic component package is applied.

The oscillator 1 including the quartz crystal resonator element 17 and the circuit element 21 of the embodiment described above can be applied as the electronic component using the electronic component package to a base station device. Hereinafter, the base station device to which the oscillator 1 is applied will be described with reference to FIG. 13. FIG. 13 is a functional block diagram showing a configuration example of a positioning system to which the base station device including the electronic component using the electronic component package is applied.

As shown in FIG. 13, the positioning system 2000 is composed of a GPS satellite 2200, a base station device 2300, and a GPS receiver 2400. The GPS satellite 2200 transmits positioning information (GPS signal).

The base station device 2300 includes a receiver 2302 that accurately receives the positioning information from the GPS satellite 2200 through an antenna 2301 placed at, for example, an electronic reference point (GPS continuous observation station), and a transmitter 2304 that transmits the positioning information received by the receiver 2302 through an antenna 2303.

Here, the receiver 2302 is an electronic apparatus including, as a reference frequency oscillation source, the oscillator 1 described above. The receiver 2302 has excellent reliability. Moreover, the positioning information received by the receiver 2302 is transmitted in real time by the transmitter 2304.

The GPS receiver 2400 includes a satellite receiving unit 2402 that receives the positioning information from the GPS satellite 2200 through an antenna 2401, and a base station receiving unit 2404 that receives the positioning information from the base station device 2300 through an antenna 2403. As described above, since the oscillator 1 with high reliability in which the risk of occurrence of the electrical short circuit (short) is reduced as described in the above embodiment is utilized as the electronic component using the electronic component package for the base station device 2300 constituting the positioning system 2000, it is possible to provide the base station device 2300 having higher reliability.

What is claimed is:

1. An electronic component package including a mounting surface on which a first external terminal is provided, the electronic component package comprising:
    a first substrate including a front surface and a side surface, the side surface including a first side surface, a second side surface crossing the first side surface, a third side surface opposed to the first side surface, a fourth side surface opposed to the second side surface, and a first recess connecting the first side surface with the second side surface;
    a first side surface terminal provided on the first side surface;
    a first recess electrode provided in the first recess and electrically connected with the first external terminal; and
    a first branch wiring provided on the front surface and including a first end exposed in the first side surface between the first side surface terminal and the first recess electrode, wherein
    in a plan view of the front surface, the relation: L11>L12 is satisfied, where L11 is the distance between the first end and the first recess electrode and L12 is the distance between the first end and the first side surface terminal, and
    the first branch wiring is electrically connected with the first side surface terminal.

2. The electronic component package according to claim 1, wherein
    a second external terminal is further provided on the mounting surface,
    the side surface further includes a second recess connecting the second side surface with the third side surface,
    the electronic component package further includes
        a second recess electrode provided in the second recess and electrically connected with the second external terminal, and
        a second branch wiring including a second end exposed in the second side surface between the first recess electrode and the second recess electrode, and
    in the plan view of the front surface, the relation: L21−L22≤LW is satisfied, where L21 is the distance between the second end and the first recess electrode, L22 is the distance between the second end and the second recess electrode, and LW is the width dimension of the second end.

3. The electronic component package according to claim 1, wherein
    a second external terminal is further provided on the mounting surface,
    the side surface further includes a second recess connecting the second side surface with the third side surface,
    the electronic component package further includes
        a second recess electrode provided in the second recess and electrically connected with the second external terminal, and
        a third branch wiring including a third end exposed in the third side surface,
    the first external terminal is an output terminal,
    the second external terminal is a power supply terminal or a ground terminal, and
    the area of an overlapping portion of the first branch wiring and the first external terminal in the plan view is smaller than the area of an overlapping portion of the third branch wiring and the second external terminal in the plan view.

4. The electronic component package according to claim 1, wherein
    the L11 satisfies the relation: 0.15 mm≤L11<PL where PL is the distance between the first recess electrode and the first side surface terminal.

5. The electronic component package according to claim 1, wherein
    the L12 satisfies the relation: 0.15 mm≤L12<(L11+L12)/2.

6. The electronic component package according to claim 2, wherein
    the L21 satisfies the relations: 0.15 mm≤L21≤PW/2 and 0.15 mm≤L22≤PW/2 where PW is the width dimension of the second side surface in a direction in which the first recess electrode, the second recess electrode, and the second end are arranged.

7. An oscillator comprising:
    the electronic component package according to claim 1;
    a resonating element accommodated in the electronic component package; and
    a circuit element including at least a portion of an oscillation circuit that causes the resonating element to oscillate.

8. An oscillator comprising:
    the electronic component package according to claim 2;
    a resonating element accommodated in the electronic component package; and
    a circuit element including at least a portion of an oscillation circuit that causes the resonating element to oscillate.

9. An oscillator comprising:
    the electronic component package according to claim 3;
    a resonating element accommodated in the electronic component package; and
    a circuit element including at least a portion of an oscillation circuit that causes the resonating element to oscillate.

10. An oscillator comprising:
    the electronic component package according to claim 4;
    a resonating element accommodated in the electronic component package; and
    a circuit element including at least a portion of an oscillation circuit that causes the resonating element to oscillate.

11. An electronic apparatus comprising an electronic component including the electronic component package according to claim 1.

12. An electronic apparatus comprising an electronic component including the electronic component package according to claim 2.

13. An electronic apparatus comprising an electronic component including the electronic component package according to claim 3.

14. A vehicle comprising an electronic component including the electronic component package according to claim 1.

15. A vehicle comprising an electronic component including the electronic component package according to claim 2.

16. A vehicle comprising an electronic component including the electronic component package according to claim 3.

\* \* \* \* \*